United States Patent [19]

Argintaru et al.

[11] Patent Number: 4,647,875
[45] Date of Patent: Mar. 3, 1987

[54] ULTRAHIGH FREQUENCY ACTIVE FILTER

[75] Inventors: Lazare Argintaru, Pre Saint Gervais; Michel Beuzer, Juvisy Sur Orge, both of France

[73] Assignee: Alcatel Thomson Faisceaux Hertziens, Levallois Cedex, France

[21] Appl. No.: 709,756

[22] Filed: Mar. 8, 1985

[30] Foreign Application Priority Data

Mar. 13, 1984 [FR] France ................ 84 03802

[51] Int. Cl.<sup>4</sup> ............................................. H03L 7/00
[52] U.S. Cl. ..................................... 331/23; 331/25; 329/122; 455/296
[58] Field of Search ......................... 331/23, 25, 30; 329/122; 455/126, 265, 296

[56] References Cited

U.S. PATENT DOCUMENTS

| | | | |
|---|---|---|---|
| 3,657,661 | 4/1972 | Jarger | 455/265 X |
| 3,845,396 | 10/1974 | Rutman | 328/15 |
| 4,313,209 | 1/1982 | Drucker | 331/23 X |
| 4,500,851 | 2/1985 | Sawa et al. | 331/25 X |

OTHER PUBLICATIONS

K. E. Schertler, "Microwave Power Up-Converters for Angle Modulated Signals Using Phase-Locked Microwave Oscillators", *Conf. Proc. of* 5th Eur.Mic.Conf., pp. 195–199.

E. Bukkert et al., "Broadband Power Up-Conversion for Microwave Radio Links Using a Phase Locked GaAs Oscillator", *Conf.Proc. of* 10th Eur.Micr.Conf., pp. 759–763.

*Primary Examiner*—Eugene R. LaRoche
*Assistant Examiner*—Robert J. Pascal
*Attorney, Agent, or Firm*—Sughrue, Mion, Zinn, Macpeak & Seas

[57] ABSTRACT

The ultrahigh frequency responsive filter according to the invention comprises an ultrahigh frequency oscillator associated with a rapid phase lock loop. The loop comprises a mixer connected with the output of the oscillator and with the output of a synthesizer. A phase comparator receives a band frequency outputted from the mixer and a phase modulated carrier signal to be filtered. The loop also has an amplifier and a low-pass filter circuit receiving the output signal of the phase comparator. The output of the low pass filter is connected with the frequency control input of the oscillator. Thus, the modulated carrier signal is transposed to the frequency of the voltage-controlled oscillator at the same time as it is subject to band pass filtering by the loop. The filter can be used for ultrahigh frequency filtering in directional radio links.

7 Claims, 4 Drawing Figures

ULTRAHIGH FREQUENCY ACTIVE FILTER

TECHNICAL FIELD

This invention relates to ultrahigh frequency filtering. The function of ultrahigh frequency filtering is delicate and expensive to put into practice when a high standard of performance is required.

BACKGROUND ART

There are several ways of realizing standard ultrahigh frequency filters with mechanical elements. These filters may be LC cell filters, varactor filters or ultrahigh frequency filters with rods. All these elements allow high-performance ultrahigh frequency filters to be assembled, but are generally expensive.

There are other types of ultrahigh frequency filters realised using micro-electronic techniques on various substrates. The filters realized according to these techniques are easier to produce, but have inferior performances; moreover, their central frequencies cannot be easily phase-shifted, for example when aiming to produce a filter which is frequency responsive.

The technical problem to be solved is therefore to produce simply and inexpensively an adjustable and high performance ultrahigh frequency filter.

SUMMARY OF THE INVENTION

According to the invention an ultrahigh frequency active filter comprises at least one ultrahigh frequency oscillator connected in a rapid phase locked loop, which oscillator is voltage-controlled and which has an output and a control input, the loop comprising a mixer, one input of which is connected with the output of the oscillator and the other input to a local generator, and a phase comparator receiving a phase modulated signal and a signal from the mixer respectively having equal or phase-shifted carrier frequencies, the output of the comparator being connected with the control input of the ultrahigh frequency oscillator by an amplifier circuit and low-pass filter with a band at least equal to the modulation band of the modulated signal.

The invention will be better understood and its other characteristics will appear with the aid of the following description with reference to the attached figures.

DESCRIPTION OF THE PREFERRED EMBODIMENTS

Figure 1:
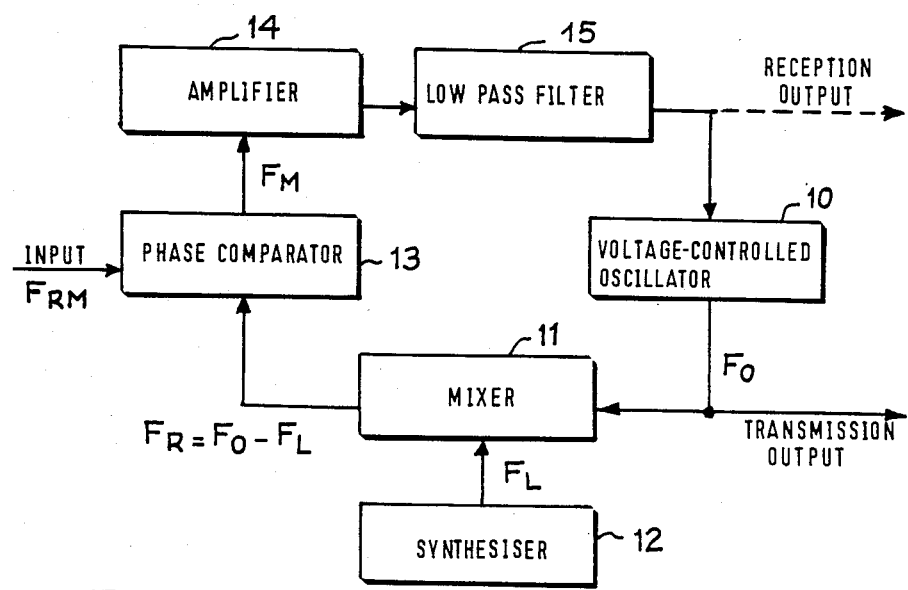
FIG. 1 is a diagrammatic representation of a first embodiment of a high frequency filter according to the invention.

The ultrahigh frequency filter according to the invention comprises not passive components, such as in the prior art arrangements using advanced mechanics or technology, but active circuits which, by virtue of their low cost and their good integration qualities, allow the problem of ultrahigh frequency filtering to be solved in an efficient manner and at low cost.

The invention makes use of the fact that a voltage-controlled oscillator used in a fast phase locked loop is capable of following the phase variations detected in this loop as long as these variations remain within the band of the phase locked loop, this band being limited by the pole of the amplifier and loop filter. This pole is said to be dominant as it is at a frequency which is lower than the cut-off frequencies associated with the other elements of the loop, for example that of the voltage-controlled oscillator.

Consequently, the voltage-controlled oscillator is capable of reproducing faithfully every modulation, within the band of the loop, which is applied to its control input. If, therefore, a signal consisting of a phase modulated carrier wave is phase-compared with a signal at the carrier wave frequency derived from the output signal of the oscillator, the modulation signal from the phase comparator can be applied to the control input of the voltage-controlled oscillator via a loop amplifier and a loop filter; the modulation signal, thus filtered, controls frequency modulation of the voltage-controlled oscillator around its central frequency. As a consequence the modulated and filtered ultrahigh frequency signal appears at the output of the voltage-controlled oscillator. Indeed, the transfer function of the dominant pole of the loop amplifier is associated directly with the frequency spectrum derived from the voltage-controlled oscillator serving as a reference. Thus, the band-pass filter previously used for ultrahigh frequencies is replaced by a low-pass filter with base band shifted to the ultrahigh frequency signal provided by an oscillator, voltage-controlled by the filtered signal, with which there is associated a rapid phase locked loop.

The reference frequency at which the frequency of the oscillator is controlled is determined by the selection of a local frequency supplied by a synthesizer or by a local oscillator and can be phase-shifted in order to shift, in the same manner, the output frequency of the oscillator, provided that the pass-band of the low-pass amplifier-filter of the loop is adequate.

The embodiment of the active ultrahigh frequency filter according to the invention utilizes the discovered properties discussed above. Its structure is as follows:

A voltage-controlled oscillator 10, having a central frequency which can lie, for example, between 2 GHz and 4 GHz, supplies its ultrahigh frequency output signal to the first input of a mixer 11 which receives at its second input a local oscillator signal derived from a local generator 12, synthesizer or local oscillator, and having a frequency $F_L$ such that $F_O - F_L = F_R$, $F_R$ being the carrier frequency of a modulated intermediate frequency signal $F_{RM}$ outputted for example from intermediate frequency stages of an emitter. This mixer provides a beat signal at the frequency $F_R$ applied to a first input of a phase comparator 13. The second input of the comparator 13 receives the signal modulated at the intermediate frequency $F_{RM}$, the carrier frequency of which is the reference frequency $F_R$. This phase comparator supplies the demodulated signal $F_M$. This demodulated signal is applied to the input of an amplifier circuit 14 followed by a loop baseband filter 15, passive or active, which subjects the modulation signal to its action. The output of the filter 15 is connected to the frequency control input of the voltage-controlled oscillator 10.

If the low-pass filter of the loop 15 is of the second order, and if $K_O$ is the output coefficient in MHz per volts of the voltage-controlled oscillator, and Kd the output coefficient in volts per radian of the phase comparator, then the cut-off frequency of the transfer function of the ultrahigh frequency filter is a function of these coefficients Ko and Kd and of the transfer function of the low-pass base band filter 15. In particular, its forward transfer gain has a slope of 12 dB/octave like that of the second order low-pass filter of the loop.

Figure 2:
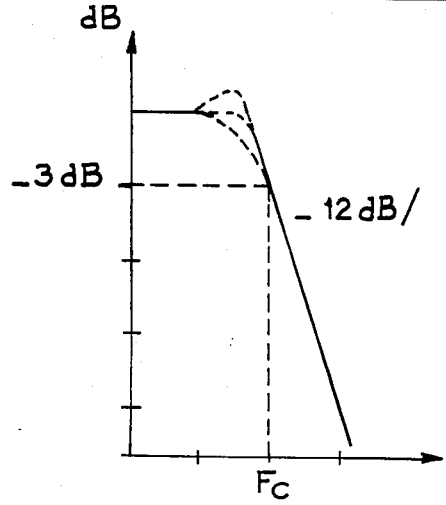
FIGS. 2 and 3 show spectra of signals at different points of the filter according to the invention.

FIG. 2 represents the baseband filtering function of the phase loop associated with the voltage controlled oscillator. The cut-off frequency $F_C$ can be in the region of 50 MHz, the slope being equal to $-12$ dB/octave.

Figure 3:
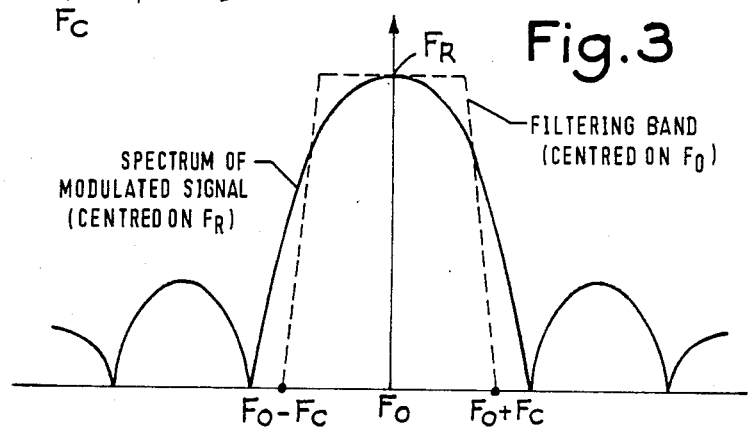

FIG. 3 shows, by a solid line, an example of a spectrum of a wave modulated by continuous phase variation using a digital signal, centered on its carrier frequency $F_R$. This same FIG. 3 shows, by a dotted line, the filtering action by the phase loop on the output of the voltage-controlled oscillator centered on the carrier frequency of the oscillator 10, $F_O$, i.e. the ultrahigh frequency filtering band.

As has been indicated above, this first embodiment provides an ultrahigh frequency bandpass filter with two poles, i.e. with 12 dB per octave, by means of a phase loop.

Figure 4:
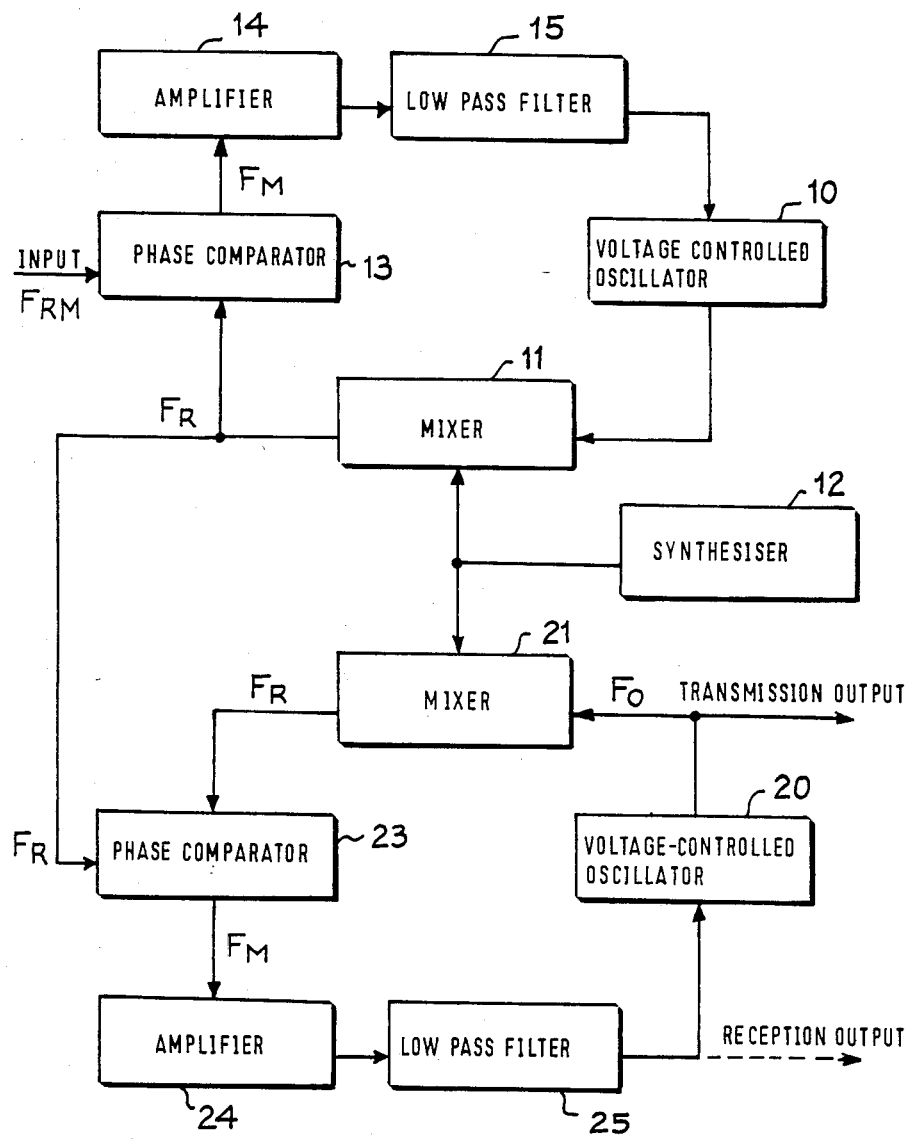
FIG. 4 is a diagrammatic representation of a second embodiment of the filter according to the invention.

The series connection of several, n say, phase loops of this type makes it possible to realize filters with 2 poles and to obtain, in this way, filtration with 12, 24, 36, 48 dB/octave. The second embodiment of the ultrahigh frequency filter according the invention, represented in FIG. 4, is an ultrahigh frequency filter with 4 poles. The same elements as in FIG. 1 have been denoted with the same reference numerals. Thus, the first voltage-controlled oscillator 10 is connected to the phase loop comprising a mixer 11 receiving the output signal of a synthesizer 12, the output of the mixer being connected to the first input of the phase comparator 13. This comparator receives at its other input the phase-modulated intermediate-frequency signal. The output of this comparator is connected via the loop amplifier 14 and the filter 15 with the control input of the voltage-controlled oscillator 10.

Instead of taking off for transmission the output signal of the voltage-controlled oscillator 10, the output signal of the mixer 11, which is the output signal of the oscillator 10 transposed in frequency, is applied to an input of a second phase comparator 23 inserted in a second phase loop, similar to the first, associated with a second voltage-controlled oscillator 20. A mixer 21 of this phase loop receives the local oscillator signal of the same synthesizer 12, and transposes to the frequency $F_R$ the output signal of the oscillator 20, this transposed signal being applied to the other input of the second phase comparator 23. In the same way as in the first phase loop, an amplifier 24 followed by a loop filter 25 transmits the modulation signal $F_M$ to the control input of the voltage-controlled oscillator 20. The transmission output of this ultrahigh frequency filtering circuit is the output of the oscillator 20. For reception, the output is the output of the filter 25. The action of this second phase locked loop makes it possible to increase the slope of the forward transfer gain at the cut-off frequencies of the ultrahigh frequency filter thus realized. The output signal of the voltage-controlled oscillator 20 is centered about the frequency $F_O$, has a band equal to the band of the rapid phase loop, and a cut off with a slope of 24 dB per octave.

By adding a third voltage-controlled oscillator associated with a similar phase loop, the inputs of the phase comparator being connected with the output of the mixer of the same loop and to that of the mixer of the preceding loop, a filter with a slope at cut off of 36 dB/octave is obtained.

The filtering band thus determined is associated with the band of the rapid phase locked loop connected with the voltage-controlled oscillator and is independent of the control frequency $F_O$ of the ultrahigh frequency filter determined by the voltage-controlled oscillator. This oscillator can just as well deliver waves which are decimetric (300 MHz to 3 GHz), centimetric (3 to 30 GHz), as millimetric (30 to 300 GHz).

The filtering performances i.e. phase delay, group delay time and ripple, basically depend upon the technological limitations introduced by the practical implementation of the loop amplifier and filter 14, 15 (24, 25), of the voltage-controlled oscillator 10 (20), of the frequency mixer 11 (21), and of the phase comparator 13 (23). If the voltage-controlled oscillator has a large transmission band its cut-off frequency does not occur as an additional pole in the transfer function of the loop, the only useful pole being the dominant pole of the loop amplifier/filter. Consequently, the voltage-controlled oscillator is capable of following easily the shifts in frequency caused by the transposition synthesizer of the loop. This ultrahigh frequency filter can therefore be a frequency responsive filter by shifting the frequency derived from the synthesizer. The output signal of the phase comparator is then the modulated signal on which there is superposed a constant component representative of the phase-shift $\Delta F_O$ desired for the central frequency $F_O$ of the oscillator.

The ultrahigh frequency filter described above is particularly interesting for the purpose of putting into practice advanced integration orientated towards solid-state techniques.

The field of application of this type of filter is extremely wide. In the embodiments described above, particularly adapted for transmission, it can be used in directional radio links, telecommunications or small economical Earth stations (single-channel) for satellite communications, for transmission of data, or for telephony.

However, an ultrahigh frequency filter of this type can equally be used for reception. The lay out is the same as that of FIG. 1, but the input receives the received modulated signal. The voltage-controlled oscillator 10 then has a frequency $F_O$, and the synthesizer 12 a local frequency $F_L$, such that the frequency resulting from the beats of $F_O$ and $F_L$ is equal to the received frequency. The modulation signal filtered by the phase loop associated with the voltage-controlled oscillator is taken off in this case at the output of the filter 15. Of course, owing to the fact that the phase comparator and the mixer each have a noise factor, the noise factor of such a system is graded relative to a standard system, and therefore this type of ultrahigh frequency filter can be used for reception only in association with a low noise amplifier placed upstream of the phase comparator and having amplification which is sufficient to mask the noise factors of the phase comparator and of the mixers.

As indicated above, an ultrahigh frequency filter of this type needs a rapid phase loop, i.e. an oscillator which is voltage controlled by way of an adequate band-pass loop. In particular, it is not envisaged that it would be possible to use in place of the oscillator a synthesizer, as the loop then varies only from the few hertz to a few hundred kilohertz, whereas the band required for a directional satellite radio link channel in order to transmit a digital train of 2 times 34 Mbits is approximately 40 MHz. The rapid phase loops described herein have pass-bands in the region of 40 to 50 MHz, that is to say that after transposition, the filtering band of the loop is in the region of 100 MHz and therefore largely sufficient for the application envisaged above.

What is claimed is:

1. An ultrahigh frequency filtering circuit comprising a voltage-controlled oscillator having an output and a control input and being connected in a loop which comprises: a mixer, the input of which is connected to the output of the oscillator, and the other input of which is connected to a device for supplying a signal at a predetermined frequency; and a phase comparator arranged to receive a phase modulated signal and a signal outputted from the mixer which signal has a frequency which is the difference between the predetermined frequency and the frequency of the signal outputted from the voltage controlled oscillator, the output of the comparator being connected to the control input of the oscillator via an amplifying means and filtering means, the filtering means having a pass band at least equal to the modulation band of the modulated signal.

2. A filtering circuit according to claim 1, for use as a transmission filter, wherein the output of the circuit is the output of the oscillator.

3. A filtering circuit according to claim 1, for use as a reception filter, wherein the output of the circuit is the output of the filtering means.

4. A filtering circuit according to claim 1, which comprises n additional such oscillators, n being greater than or equal to one, each additional oscillator having the same central frequency $F_O$, and each one being connected in an additional loop such as the first-mentioned loop, each additional mixer having an input connected to the output of the corresponding oscillator and another output receiving a signal at said predetermined frequency, the phase comparator of each of the additional loops being arranged to receive a signal derived from the mixer of another one of the loops, the forward transfer gain of the filtering circuit having a slope at the cut-off frequency equal to n times the slope at the cut-off frequency of the forward transfer gain of the filtering means.

5. A filtering circuit according to claim 1, wherein the central frequency, which is equal to the central frequency of the oscillator when the carrier frequency of the phase modulated signal is equal to the frequency of the signal outputted from the mixer, can be phase-shifted by shifting the predetermined frequency.

6. A filtering circuit according to claim 1 in which the filtering means is a low pass filter.

7. A filtering circuit according to claim 1, further comprising means for varying the predetermined frequency provided from said device for supplying.

* * * * *